(12) United States Patent
Nagaya et al.

(10) Patent No.: US 7,063,813 B1
(45) Date of Patent: Jun. 20, 2006

(54) STACKED CERAMIC BODY AND PRODUCTION METHOD THEREOF

(75) Inventors: Toshiatsu Nagaya, Kuwana (JP); Takashi Yamamoto, Chiryu (JP); Akira Fujii, Yokkaichi (JP); Atsuhiro Sumiya, Hekinan (JP); Hitoshi Shindo, Okazaki (JP); Eturo Yasuda, Okazaki (JP)

(73) Assignee: Denso Corporation, Aichi (JP)

( * ) Notice: Subject to any disclaimer, the term of this patent is extended or adjusted under 35 U.S.C. 154(b) by 431 days.

(21) Appl. No.: 10/318,359

(22) Filed: Dec. 13, 2002

(30) Foreign Application Priority Data

Dec. 14, 2001 (JP) .............................. 2001-381933
Nov. 15, 2002 (JP) .............................. 2002-332217

(51) Int. Cl.
*C04B 37/00* (2006.01)
*C04B 33/32* (2006.01)

(52) U.S. Cl. ...................... 264/676; 264/675; 264/674; 156/89.12; 156/89.18

(58) Field of Classification Search ............. 156/89.12, 156/89.14, 89.18, 94.14; 264/674, 675, 676
See application file for complete search history.

(56) References Cited

U.S. PATENT DOCUMENTS

| 4,977,485 A | * | 12/1990 | Mori et al. ............... 361/321.4 |
| 5,512,353 A | * | 4/1996 | Yokotani et al. ............ 428/210 |
| 5,672,220 A | | 9/1997 | Omori et al. |
| 2002/0079622 A1 | * | 6/2002 | Randall et al. ............. 264/618 |
| 2002/0098333 A1 | | 7/2002 | Feltz et al. |

FOREIGN PATENT DOCUMENTS

| DE | 43 17 719 A1 | 12/1993 |
| DE | 10 062 672 A1 | 8/2001 |
| JP | A-5-82387 | 4/1993 |

* cited by examiner

*Primary Examiner*—Steven P. Griffin
*Assistant Examiner*—Carmen Lyles-Irving
(74) *Attorney, Agent, or Firm*—Nixons & Vanderhye P.C.

(57) ABSTRACT

This invention provides a stacked ceramic body that prevents reaction between components of dielectric layers and components of electrode layers of an unsintered stacked body during sintering and in which both components do not easily form a liquid phase, and a production method of such a stacked ceramic body. A print portion 13 is formed on a green sheet 1, 12 containing lead by use of an electrode paste consisting of copper oxide as its main component. A desired number of print sheets 10 are stacked to give an unsintered stacked body 15. Degreasing is conducted in an atmosphere to degrease organic components. The print portion 13 is subjected to reducing treatment in a reducing atmosphere containing hydrogen and is converted to a print portion 13 containing copper as its main component. The unsintered stacked body 15 is sintered in a reducing atmosphere. Dielectric layers containing lead and electrode layers for applying a voltage to the dielectric layers are alternately stacked, and an oxidation portion containing copper is formed in the proximity of a surface of the electrode layer. A thickness of the oxidation portion in a stacking direction is 0.5 to 2 μm and a copper content in the oxidation portion is 1 to 30 wt %.

5 Claims, 12 Drawing Sheets

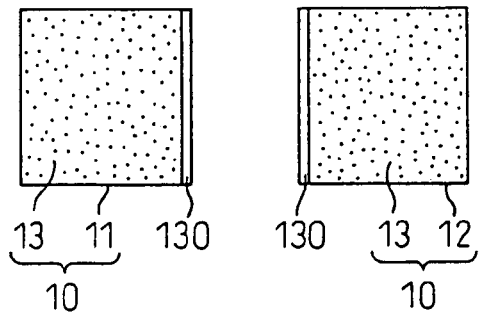
Fig.1(a)
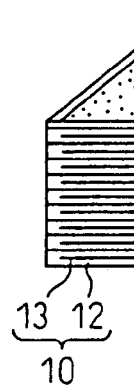 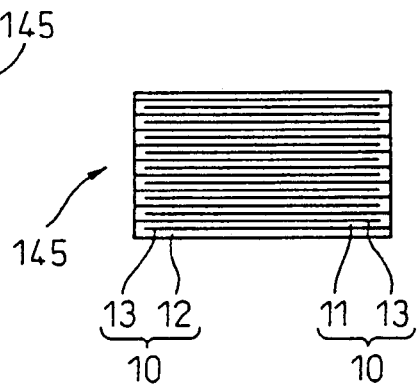
Fig.1(b)   Fig.1(c)
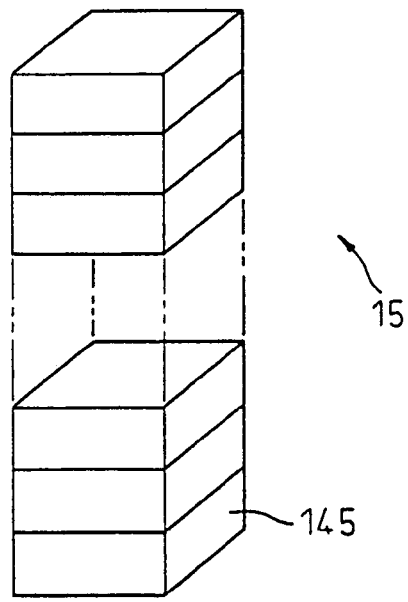
Fig.1(d)

STACKED CERAMIC BODY AND PRODUCTION METHOD THEREOF

BACKGROUND OF THE INVENTION

1. Field of the Invention

This invention relates to a stacked ceramic body that can be utilized as a piezoelectric device for a piezoelectric actuator, and a production method thereof.

2. Description of the Related Art

Piezoelectric devices comprising stacked ceramic bodies, fabricated by alternately stacking a plurality of dielectric layers and electrode layers for applying a voltage to the dielectric layers, are known. Among them, a stacked ceramic body the dielectric layer of which is formed of lead zirconate titanate (PZT) and the electrode of which is formed of copper has gained a wide application as a piezoelectric device because it is economical and is considerably free from the migration that has been observed in a silver-palladium electrode.

In the stacked ceramic body including the dielectric layers containing lead and the electrode layers containing copper, however, metallic lead is isolated from the dielectric layer during sintering of an unsintered stacked body in a production process of the stacked ceramic body, and this metallic lead and metallic copper of the electrode layer together form a liquid phase and flow out in some cases. Further, the electrode layer often aggregates and is interrupted due to the reaction between metallic lead isolated from the dielectric layer and metallic copper of the electrode layer (see later-appearing FIGS. 1(a) and 1(b)). Lead oxide contained in the dielectric layer forms a liquid phase with copper oxide, is diffused into the dielectric layer, and sometimes denatures the dielectric layer.

SUMMARY OF THE INVENTION

In view of the problems of the prior art technologies described above, this invention provides a stacked ceramic body that prevents reaction between components of dielectric layers and components of electrode layers of an unsintered stacked body during sintering and in which both components do not easily form a liquid phase, and a production method of such a stacked ceramic body.

According to a first aspect of the invention, there is provided a method of producing a stacked ceramic body comprising the steps of arranging a print portion formed of an electrode paste consisting of copper or a copper compound as its main component on a green sheet formed of an oxide dielectric containing a lead oxide as its constituent element to form a print sheet; stacking a plurality of the print sheets to form an unsintered stacked body; conducting degreasing treatment by heat-treating and removing organic components contained in the unsintered stacked body; and sintering the unsintered stacked body in a reducing atmosphere from room temperature to 400 to 600° C. while controlling an oxygen partial pressure to an oxygen partial pressure at which copper and lead oxide can coexist, or an oxygen partial pressure higher than the oxygen partial pressure at which copper and lead oxide can coexist.

The operation and effect of the first invention will be explained. The first invention conducts degreasing treatment of the unsintered stacked body and sinters the unsintered stacked body in a reducing atmosphere.

When lead is isolated from the green sheet to operate as the dielectric layer during sintering in the reducing atmosphere, this lead reacts with copper of the print portion, forms a liquid phase and is pushed out in some cases while involving other components of the green sheet and print portions. Aggregation is also likely to occur in the print portion.

Such isolation of lead occurs when the dielectric material in the green sheet is reduced during the reducing treatment of the unsintered stacked body and also when the dielectric material in the green sheet is reduced at a sintering temperature of less than 600° C. in the reducing atmosphere.

According to the first invention, the reducing atmosphere from the room temperature to 400 to 600° C. is controlled to an oxygen partial pressure at which copper and lead oxide can coexist, or an oxygen partial pressure higher than the oxygen partial pressure at which copper and lead oxide can coexist. Furthermore, lead that has already been isolated is oxidized. Because isolation of lead during sintering is thus prevented, lead does not increase any more. Therefore, the reaction does not easily occur between isolated lead and copper, and aggregation of the print portion and flow-out of the material from inside the unsintered stacked body do not easily occur.

As the oxygen partial pressure is controlled in reduction and sintering, copper in the proximity of an exposed portion of the print portion of the unsintered stacked body is oxidized to copper oxide that does not react with lead. Therefore, even when lead and copper react inside the unsintered stacked body and part of them is liquefied, flow-out of the materials from inside the stacked body does not easily occur.

According to a second aspect of the invention, there is provided a stacked ceramic body produced by alternately stacking dielectric layers containing lead and electrode layers containing copper for applying a voltage to the dielectric layers, wherein exposed portions of the electrode layers to outside and portions in the proximity of the exposed portions are oxidation portions.

In the second invention, the oxidation portion exists at the portion of the electrode layer exposed to the outside and in proximity to the exposed portion. This oxidation portion can prevent flow-out of the materials from inside the liquefied unsintered stacked body. As the stacked ceramic body is produced by the method according to the first invention, aggregation of the print portion does not easily occur.

The first and second inventions described above provide a stacked ceramic body in which the reaction does not easily occur between the component of the dielectric layer and, in the components of the electrode layer of the unsintered stacked body during its sintering, both components are not easily liquefied and the liquefied component does not easily flow out, and also provides a production method thereof.

BRIEF DESCRIPTION OF THE DRAWINGS

FIGS. 1(a) to 1(d) are explanatory views each showing a production method of an unsintered stacked body in an embodiment of the invention;

DESCRIPTION OF THE PREFERRED EMBODIMENTS

Figure 2:
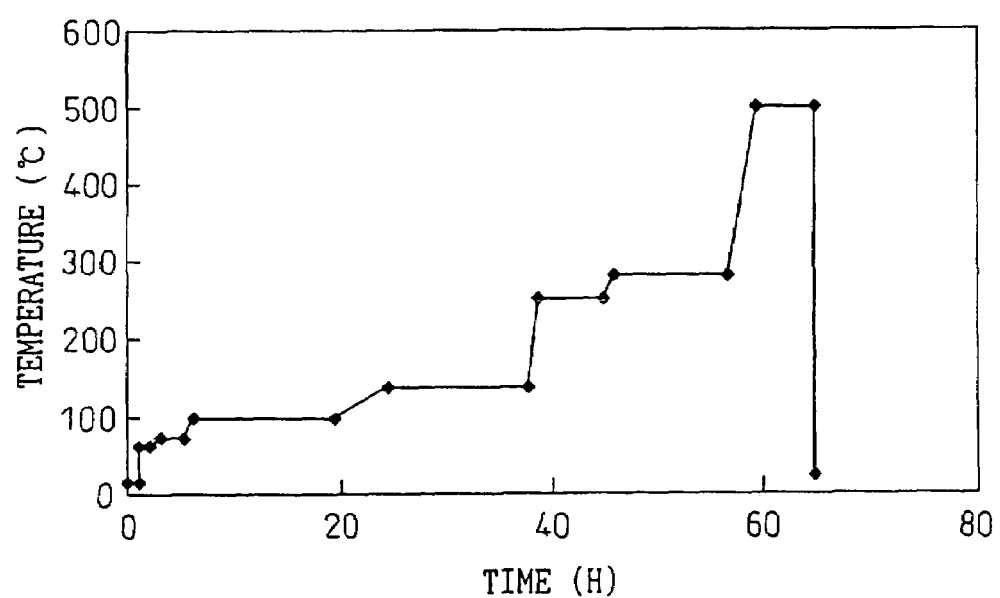
FIG. 2 is a diagram showing a temperature profile during degreasing in the embodiment of the invention.

In the first and second inventions, the dielectric material that constitutes the green sheet is a composite compound containing a lead oxide such as lead zirconate titanate, $Pb(Mg_{1/3}Nb_{2/3})O_3$ and so forth. The print portion described above is formed of copper or a copper compound. It may be copper not containing any impurity or a compound of copper with Ni or Zn.

A print portion formed of an electrode paste that contains copper oxide as its main component is preferably arranged to form a print sheet.

The print portion consisting of copper oxide contained in the unsintered stacked body is preferably subjected to reducing treatment in a hydrogen-containing reducing atmosphere to form the print portion consisting of copper as its main component. When subjected to the reducing treatment in the hydrogen-containing reducing atmosphere, copper oxide is converted to the electrode layer consisting mainly of copper. A material capable of achieving such conversion is selected as a material for the electrode paste. The copper oxide includes both monovalent and divalent oxides.

The volume of the unsintered stacked body is preferably 8 $mm^3$ or more. When this condition is satisfied, prevention of the reaction between isolated lead and copper, aggregation of the print portion and the flow-out of the materials from inside the unsintered stacked body mentioned in the first invention can be more reliably achieved.

In the first invention, sintering is carried out while the oxygen partial pressure is controlled to an oxygen partial pressure at which copper and lead oxide can coexist, or to a higher oxygen partial pressure than the oxygen partial pressure oxygen partial pressure at which copper and lead oxide can coexist, until the temperature is elevated from the room temperature to 400 to 600° C. When the oxygen partial pressure is controlled to the pressures other than the range of the oxygen partial pressure described above in this temperature range, metallic lead is isolated, forms a liquid phase with metallic copper and is likely to flow out.

When the volume of the unsintered stacked body is smaller than 8 $mm^3$ in the first invention, copper in the proximity of the surface of the unsintered stacked body is likely to be oxidized by oxygen that diffuses from an external atmosphere into the unsintered stacked body during sintering. In this case, conductivity of the electrode layer drops when the print portion changes to the electrode layer, and the operation as the electrode cannot be exhibited easily.

Even if machining such as grinding is applied after sintering, oxidation of the electrode proceeds in most cases to a portion deeper than a range that can be removed by grinding (grinding margin), and it is difficult to allow the electrode layer operate as the electrode by grinding. When the electrode layer is partially oxidized, a sufficient voltage cannot be applied easily to the dielectric layer due to conduction defects when a stacked ceramic body obtained from the unsintered stacked body is used as a piezoelectric device. Therefore, performance of the piezoelectric device is likely to drop.

The shapes of the green sheet and the print portion (that is, the dielectric layer and the insulating layer) are square in the later-appearing example, but they can be formed into desired shapes such as a rectangular shape, a polygonal shape, a round shape, a barrel shape, an elliptic shape, and so forth.

Next, to sinter the unsintered stacked body in the reducing atmosphere, the temperature elevation is started from the room temperature. In this case, the oxygen partial pressure in the reducing atmosphere is preferably controlled to $10^{-10}$ to $10^{-20}$ atm ($1.013 \times 10^{-5} (=10^{-4.994})$ to $1.013 \times 10^{-15}$ ($=10^{-14.99}$)Pa).

When the oxygen partial pressure is controlled to the specific range described above in the temperature range from the room temperature to 400 to 600° C., sintering can be carried out at the oxygen partial pressure at which copper and lead oxide can coexist or at an oxygen partial pressure higher than the oxygen partial pressure at which copper and lead oxide can coexist. Therefore, the reaction between metallic lead and metallic copper can be prevented. An oxidation portion can be formed more easily, as will be later described.

Next, to sinter the unsintered stacked body in the reducing atmosphere, the temperature elevation is continued from 400 to 600° C. In this case, it is preferred to control the oxygen partial pressure in the reducing atmosphere to the oxygen partial pressure at which copper and lead oxide can coexist, or to a higher oxygen pressure than the oxygen partial pressure at which copper and lead oxide can coexist, until the temperature reaches 900 to 1,000° C.

When the temperature elevation is continued from 400 to 600° C. and the oxygen partial pressure is so controlled as to satisfy the condition described above until the temperature reaches 900 to 1,000° C., reduction sintering can be carried out while the state under which copper and lead coexist is kept as such.

When the oxygen partial pressure is less than $10^{-20}$ atm ($1.013 \times 10^{-5} (=10^{-4.994})$Pa) while the temperature reaches 400 to 600° C., sintering is conducted in a range other than the Cu+PbO coexisting range. Therefore, metallic lead is isolated from the green sheet to operate as the dielectric layer, and metallic copper of the print portion to operate as the electrode layer and metallic lead together form a liquid phase and are likely to flow out.

When the oxygen partial pressure is greater than $10^{-10}$ atm ($1.013 \times 10^{-5}$ ($=10^{-4.994}$)Pa) till the temperature reaches 400 to 600° C., the portion of the print portion that comes into contact with oxygen is broadly oxidized, the electric resistance of the electrode layer obtained from this print portion becomes great and the function of the electrode is likely to drop. Lead oxide and copper oxide of the green sheet together form the liquid phase and are likely to diffuse into the green sheet, that is, into the dielectric layer.

When the oxygen partial pressure, until the temperature reaches 900 to 1,000° C., is within the range of the oxygen partial pressure at which copper and lead oxide can coexist, metallic lead is isolated from the green sheet to operate as the dielectric layer, and metallic copper and metallic lead of the print portion to operate as the electrode layer together form the liquid phase and are likely to flow out. When the oxygen partial pressure is lower than the oxygen partial pressure at which copper and lead oxide can coexist, metallic lead is isolated, and metallic copper and metallic lead of the print portion to operate as the electrode layer together form the liquid phase and are likely to flow out. Furthermore, formation of an oxidation portion to be later described becomes difficult and peeling is likely to occur between the dielectric layer and the electrode layer.

Next, the requirement "to control the oxygen partial pressure to an oxygen partial pressure at which copper and lead oxide can coexist, or to a higher oxygen partial pressure than the oxygen partial pressure at which copper and lead oxide can coexist, until the temperature reaches 900 to 1,000° C. while the temperature elevation is continued" will be explained. An oxygen partial pressure of an atmosphere determines whether copper changes to a copper oxide or lead changes to a lead oxide in a system containing both copper and lead. A specific range of the oxygen partial pressure exists at which copper is not oxidized but lead is oxidized to lead oxide and both of them coexist. According to claim 5, the oxygen partial pressure is kept at the oxygen partial pressure at which copper and lead oxide coexist or at a higher oxygen partial pressure (towards the oxidation side) than this Cu+PbO coexisting oxygen partial pressure range.

Figure 10:
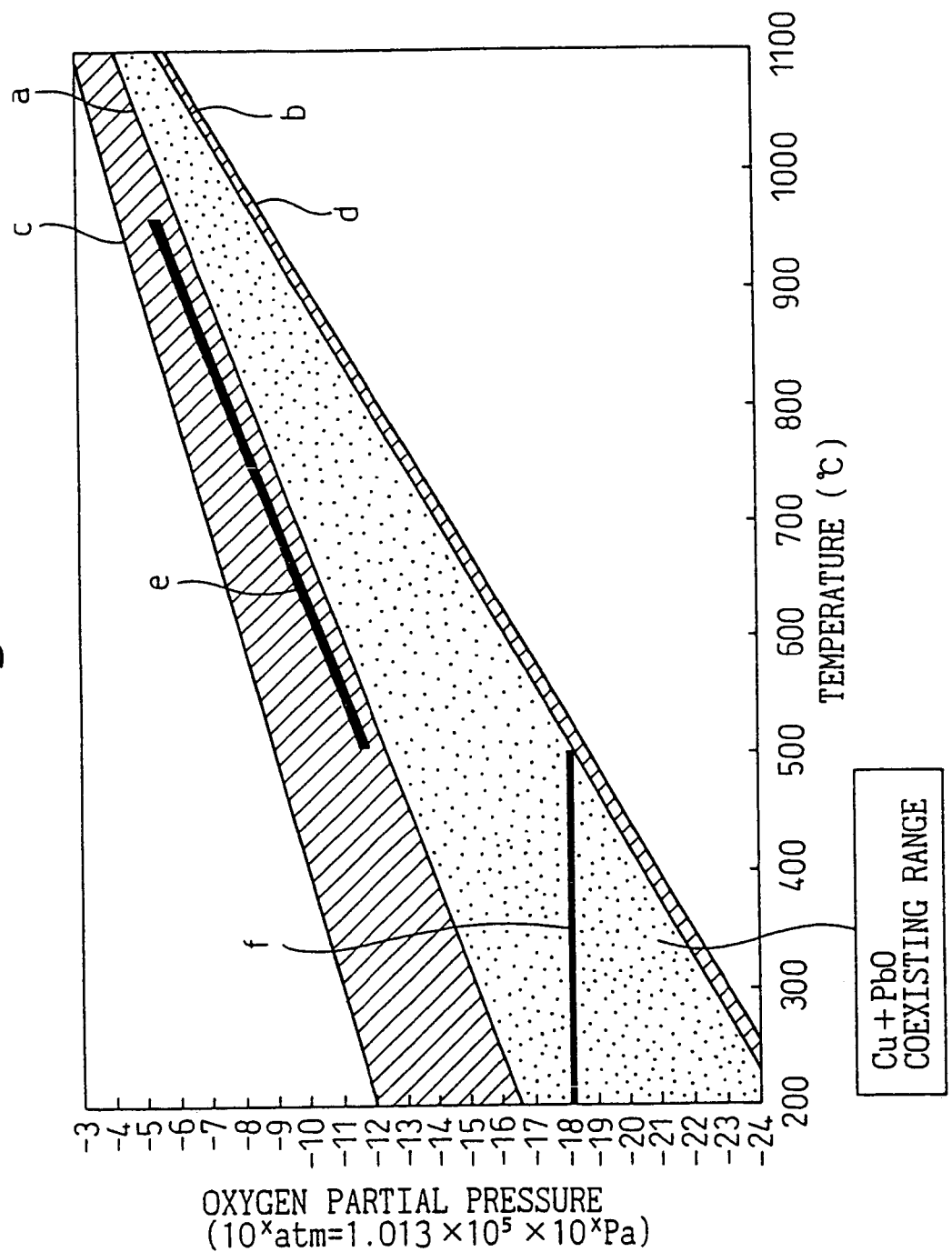
FIG. 10 is a diagram showing a Cu+PbO coexisting range and the range for the temperature and the oxygen partial pressure during sintering in the embodiment of the invention.

As concretely shown in the diagram of FIG. 10, the range encompassed by solid line a and solid line b is the coexisting range of copper and lead oxide, and claim 5 stipulates that sintering is carried out in this range or in a range having a higher oxygen partial pressure. Incidentally, 1 atm=1,013 hPa=1.013×10$^5$ Pa.

When the unsintered stacked body is sintered in the reducing atmosphere, the oxygen partial pressure is preferably controlled so as to satisfy the following condition at each temperature:

1,000° C.:

$10^{-4}$ to $10^{-7.9}$ atm ($10.13(10^{1.0056})$ to $1.276 \times 10^{-3}$ ($=10^{-2.894}$)Pa)

900° C.:

$10^{-5}$ to $10^{-10.1}$ atm ($1.013(=10^{0.0056})$ to $8.049 \times 10^{-6}$ ($=10^{-5.094}$)Pa)

800° C.:

$10^{-6}$ to $10^{12.2}$ atm ($1.013 \times 10^{-1}(=10^{-0.9944})$ to $6.393 \times 10^{-8}$ ($=10^{-7.194}$)Pa)

700° C.:

$10^{-7}$ to $10^{-14.5}$ atm ($1.013 \times 10^{-2}(=10^{-1.994})$ to $3.204 \times 10^{-10}(=10^{-9.494})$Pa)

600° C.:

$10^{-8}$ to $10^{-16.6}$ atm ($1.013 \times 10^{-3}(=10^{-2.994})$ to $2.54 \times 10^{-12}(=10^{-11.59})$Pa)

500° C.:

$10^{-9}$ to $10^{-18.8}$ atm ($1.013 \times 10^{-4}(=10^{-3.994})$ to $1.606 \times 10^{-14}(=10^{-13.79})$Pa)

When sintering is carried out while the oxygen partial pressure is kept at the value at each temperature range described above, sintering can be conducted at the oxygen partial pressure at which copper and lead oxide can coexist, or at a higher oxygen partial pressure than the Cu+PbO coexisting oxygen partial pressure, and it is possible to prevent metallic lead from being isolated from the green sheet to operate as the dielectric layer, and to prevent metallic copper and metallic lead of the print portion to operate as the electrode layer from forming the liquid phase and flowing out, as can be understood from later-appearing FIG. 10.

When sintering is conducted within a range deviated towards the reduction side from the oxygen partial pressure corresponding to each temperature range, metallic lead is isolated, and metallic copper and metallic lead of the print portion to operate as the electrode layer together form the liquid phase and are likely to flow out. Formation of the oxidation portion to be later described becomes difficult and the dielectric layer and the electrode layer are likely to peel. When sintering is conducted within a range deviated towards the oxidation side from the oxygen partial pressure corresponding to each temperature range, other dielectric materials, non-reacted lead oxide and copper oxide slightly formed at the print portion to operate as the electrode layer together form the liquid phase and are likely to diffuse into the stacked body.

Next, in the second invention, an oxidation width of the oxidation portion measured in a direction vertical to the stacking direction of the electrode layer is preferably from 0.05 to 2 mm. When this condition is satisfied, it is possible to acquire an oxidation portion sufficient to cut off the outflow of the materials when the liquid phase is formed inside. When the oxidation width of the oxidation portion is less than 0.05 mm, it becomes impossible in some cases to prevent the outflow when metallic copper and metallic lead isolated from inside the green sheet react with each other and form the liquid phase. When the oxidation width is greater than 2 mm, on the other hand, the electrode layer is covered with a thick oxide film and conductivity of the electrode layer is likely to drop.

Even when machining such as grinding is applied after sintering, oxidation of the electrode layer practically proceeds in many cases to a deeper portion than the range that can be removed by grinding, and it is difficult to let the electrode layer function as the electrode by grinding. When the stacked ceramic body having a broad oxidation portion is used as the piezoelectric device, performance of the piezoelectric device is likely to drop due to conduction defect of the electrode layer.

Incidentally, the oxidation width employs a maximum width that is measured from an end portion of the stacked ceramic body to the end of the oxidation portion in a direction vertical to the stacking direction of the stacked ceramic body.

In the second invention, at least one diffusion portion formed by diffusion of at least one kind of components constituting the electrode layer preferably exists in the proximity of the interface with the electrode layer in the dielectric layer. This oxidation portion provides sufficient adhesion strength between the dielectric layer and the electrode layer. Incidentally, the thickness of the oxidation portion in the invention uses a maximum thickness measured from the surface of the electrode layer in the stacking direction of the stacked ceramic body.

In the diffusion portion in the second invention, copper originating from the electrode layer is under the diffused state, a diffusion distance from the interface between the dielectric layer and the electrode layer in the diffusion portion is 0.5 to 2 μm, and the content of copper is preferably 0.1 to 30 wt %. When this condition is satisfied, the drop of the insulation resistance can be suppressed.

When the diffusion distance is less than 0.5 μm, the adhesion strength is not sufficient between the dielectric layer and the electrode layer, and peeling is likely to occur between these layers. When the diffusion distance is greater than 2 μm, a dielectric portion or a low insulation resistance portion having another composition that contains copper is formed in a laminar form or in a sparsely scattered form inside the dielectric layer. As the insulation resistance of the dielectric layer drops in this case, dielectric breakdown is likely to occur in the dielectric layer when this stacked ceramic body is used as the piezoelectric device.

When the copper content is less than 0.1 wt %, the adhesion strength of the oxidation portion becomes weak and peel is likely to occur between the dielectric layer and the electrode layer. When the copper content is greater than 30 wt %, the insulation resistance of the dielectric layer is likely to drop.

In the second invention, the stacked ceramic body is preferably the piezoelectric device. In the stacked ceramic body according to the second invention, the dielectric layer and the electrode layer do not easily peel. Therefore, when the stacked ceramic body is caused to operate as the piezoelectric device, the stacked ceramic body undergoes extension and contraction in the stacking direction. However, the dielectric layer and the electrode layer do not easily peel due to this extension and contraction, and the piezoelectric device has excellent durability.

As the electrode layer keeps sufficient electric conductivity, the voltage can be reliably applied to the dielectric layer. Moreover, a voltage necessary for sufficiently extending and contracting the dielectric layer can be reliably applied. Therefore, an excellent piezoelectric device can be obtained. In this way, the stacked ceramic body according to the second invention can be utilized as an excellent piezoelectric device.

Hereinafter, an example of the invention will be explained with reference to the accompanying drawings. A method of producing a stacked ceramic body 1 (see FIGS. 1(a) to 1(d)) according to this example first forms a print portion 13 formed of an electrode paste consisting of copper oxide as a main component on green sheets 11 and 12 containing a lead oxide as its constituent element to obtain a print sheet 10, and then stacks a plurality of print sheets 10 to obtain an unsintered stacked body 15 as shown in FIGS. 1(a) to 1(d).

Next, a degreasing treatment for removing a binder contained in the unsintered stacked body is carried out by heat-treating the organic components contained in the unsintered stacked body 15 in the atmosphere. Reducing treatment of the print portion 13 consisting of copper oxide contained in the unsintered stacked body as the main component is carried out to convert the print portion 13 to the one that consists of copper as the main component. The unsintered stacked body is then sintered in a reducing atmosphere and at an oxygen partial pressure at which copper and lead oxide can coexist, or at a higher oxygen partial pressure than the oxygen partial pressure at which copper and lead oxide can coexist, until the temperature is elevated from room temperature to 400 to 600° C.

Figure 11A:
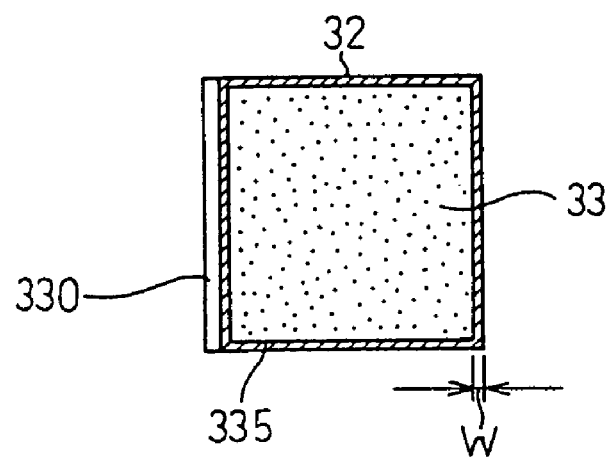
FIG. 11(*a*) is an explanatory view of an electrode layer and an oxidation portion (a sectional explanatory view taken along line A—A in FIG. 11(*b*)), and FIG. 11(*b*) is an explanatory view of a stacked ceramic body.
Figure 11B:
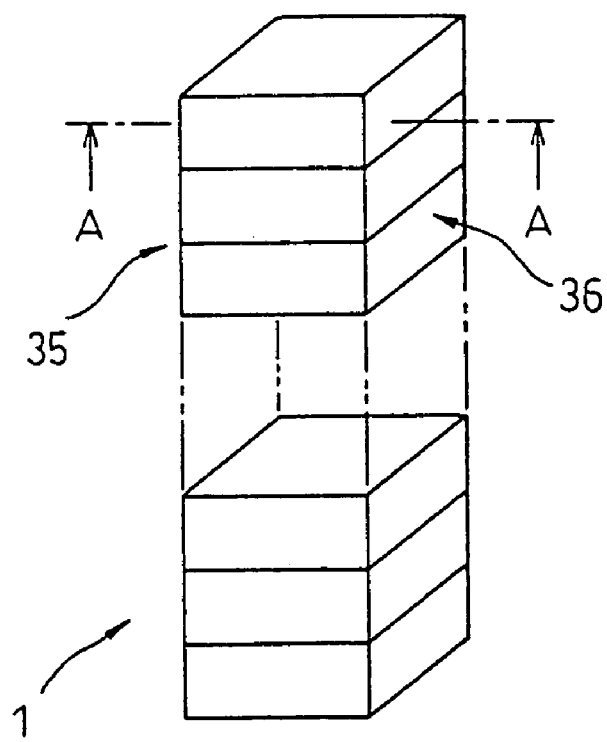

In the way described above, there is obtained the stacked ceramic body 1 in which the dielectric layers 31 and 32 containing lead and the electrode layers 33 containing copper for applying the voltage to these dielectric layers 31 and 32 are alternately stacked and the exposed portion of the electrode layers 33 to the outside and the portions near the exposed portion are formed of the oxidation portion 335 as shown in FIGS. 11(a) and 11(b).

Hereinafter, the explanation will be given in detail. The stacked ceramic body in this example is a piezoelectric device that can be utilized as a driving source of a piezoelectric actuator. This stacked ceramic body 1 is fabricated by alternately stacking the dielectric layers 31 and 32 formed of lead zirconate titanate (hereinafter called "PZT"; its detailed composition will be described in a later-appearing production method) and the electrode layers 33 consisting of copper oxide as its main component. Incidentally, FIGS. 1(a) to 1(d) show the stacking state of the unsintered stacked body, but the same structure is essentially kept after sintering (though shrinkage occurs to some extents due to sintering).

In other words, the stacked ceramic body 1 includes the dielectric layers 31 and 32, the electrode layer 33 formed on the surface of each dielectric layer 31 and 32, and a non-formation portion 330, where the electrode layer 33 is not formed, on one of the side surfaces of each dielectric layer 31 and 32 (see FIGS. 11(a) and 11(b)). In the stacked ceramic body 1 of this example, the dielectric layers 31 and 32 are stacked in regular order in such a manner that the non-formation portions 330 of the electrode layers 33 alternately appear on the different side surfaces 35 and 36.

Next, the production method of the stacked ceramic body 1 will be explained in detail. First, green sheets 11 and 12 for the dielectric layers 31 and 32 are prepared. Lead oxide and tungsten oxide are weighed to 83.5 wt % and 16.5 wt %, respectively, are dry mixed and are then sintered at 500° C. for 2 hours. There is thus obtained calcined powder (chemical formula: $Pb_{0.835}W_{0.165}O_{1.33}$) in which lead oxide and a part of tungsten oxide react with each other. This calcined powder is finely granulated and dried in a medium-stirring mill to improve reactivity and to obtain assistant oxide powder.

The dielectric layers 31 and 32 in the piezoelectric device 1 of this example is PZT which has a ternary solid solution of $Pb(Y_{0.5}Nb_{0.5})O_3$—$PbTiO_3$—$PbZrO_3$ system as its basic composition and in which Sr replaces a part of Pb. The composition of the starting materials is selected so that the final composition achieves the compound described above. The starting materials are dry mixed and are sintered at 850° C. for 7 hours. In this way is obtained dielectric calcined powder.

Next, 2.5 L of water and a dispersant (2.5 wt % on the basis of the dielectric calcined powder) are mixed in advance, and 4.7 kg of the dielectric calcined powder is gradually mixed to obtain slurry of the dielectric calcined powder. This dielectric calcined powder slurry is stirred in a medium-stirring mill, and the particle diameter of the dielectric calcined powder in the slurry is controlled to 0.2 μm or below by use of a pearl mill.

To the dielectric calcined powder slurry are added 4 wt % of a binder on the basis of the weight of the dielectric calcined powder in the slurry, 1.9 wt % of a mold release agent on the basis of the weight of the dielectric calcined powder in the slurry and 13.5 g of the assistant oxide powder described above on the basis of 1,600 g of the dielectric calcined powder in the slurry (0.5 atom % in the chemical formula $Pb_{0.835}W_{0.165}O_{1.33}$ of the assistant oxide powder). The mixture is stirred for 3 hours and is dried by use of a spray dryer to give a granulated powder.

The granulated powder is further granulated finely for a night and a day and is mixed with water. A sheet is then shaped with a blade interval of 125 μm by a doctor blade method. After being dried at 80° C., the sheet is cut into a size of 100 mm by 150 mm by using a sheet cutter. There are thus obtained the green sheets 11 and 12.

Next, the print portion 13 is formed on each green sheet 11 and 12. To 1,800 g of CuO paste (CuO content: 50 wt %, CuO specific surface area: 10 m²/g with the balance of binder) are added 1.11 g of 1050YPCu powder (mixed powder of yttria, phosphorus and copper), a product of Mitsui Metal Co. and 0.09 g of duplicate powder (powder having the same components as the calcined powder for the dielectric layer or containing a part of the components). These materials are then mixed inside a centrifugal defoaming apparatus to give an electrode paste. The electrode paste is printed to a thickness of 5 to 8 μm on the green sheets by use of a screen-printing apparatus and is dried at 130° C. for 1 hour.

The green sheets 11 and 12 having the print portion 13 is obtained in this way as shown in FIG. 1(a).

The non-formation portions 130 of the print portions 13 are disposed in such a manner as to appear on the opposing side surfaces between the adjacent dielectric layers 31 and 32 at the time of stacking. Therefore, as shown in FIG. 1(a), two kinds of green sheets having the non-formation portion 130 positioned in a different direction are prepared. Since the periphery of each green sheet 11 and 12 is finally cut, the print portion 13 is disposed in consideration of the cut margin.

Next, twenty green sheets 11 and 12 are stacked as shown in FIG. 1(b). The stacked body is fixed to a press jig and is thermally press-bonded at 120° C. and 80 kg/m$^2$ for 10 minutes to give a mother block. This mother block is cut to a side of 9 mm×9 mm by use of a sheet cutter. Each fragment cut from the mother block is put to a laminator and is again thermally press-bonded at 120° C. and 160 kg/m$^2$ for 10 minutes. Consequently, there is obtained a unit device 145 shown in FIG. 1(c).

Twenty unit devices 145 are stacked and put to the laminator and are further thermally press-bonded at 80° C. and 500 kg/m$^2$ for 10 minutes to give an unsintered stacked body 15 as shown in FIG. 1(d). Each green sheet 11, 12 has a square shape having a side of 9 mm and a thickness of 0.1 mm inside the unsintered stacked body 15. Therefore, the volume of the unsintered stacked body 15 is 3,240 mm$^3$ (the thickness of the print portion 13 can be neglected because it is extremely small).

Magnesium oxide sheets having a porosity of 20% (15×15 mm×1 mm) are placed on and below the unsintered stacked body 15. Degreasing is carried out inside a gas circulation type degreasing furnace in an atmosphere in accordance with a temperature profile (a diagram showing the relation between the time from the start of the degreasing treatment and the temperature) shown in FIG. 2.

Figure 3A:
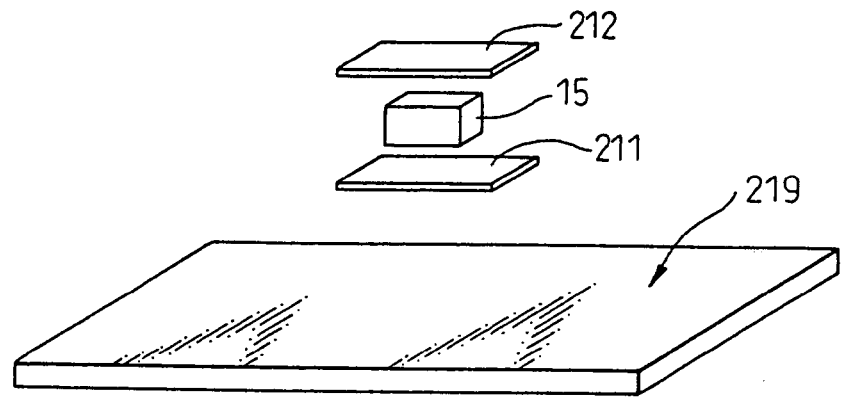
FIGS. 3(a) to 3(c) are explanatory views each showing an arrangement state of an unsintered stacked body during degreasing in the embodiment of the invention.

Degreasing is carried out while a ventilation plate 211, the unsintered stacked body 15 and an upper side ventilation plate 212 are placed on a bottom surface 219 of a saggar 21 (the same as the one used for sintering; see FIG. 6) as shown in FIG. 3(a). The ventilation plates 211 and 212 may be formed of ceramic. In this case, a ceramic plate having a porosity of at least 10% is preferably used to secure ventilation though the ceramic material is not specifically limited. The upper and lower ventilation plate may be formed of the same material. The size of the upper and lower ventilation plates 211 and 212 may be different so long as the ventilation property remains substantially equal.

Figure 3B:
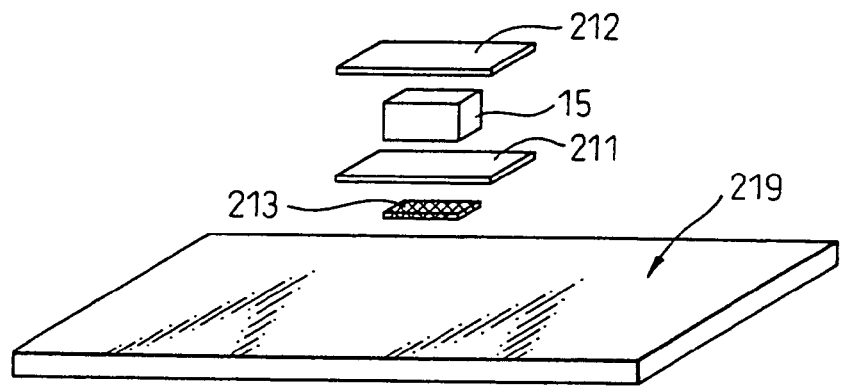
Figure 3C:
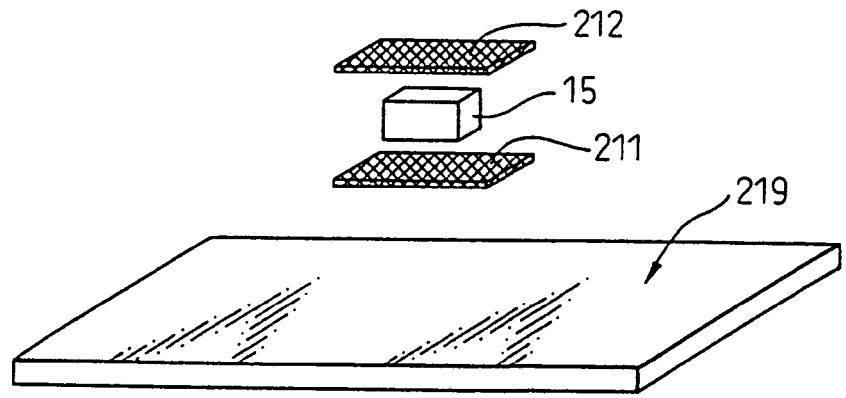
Figure 4:
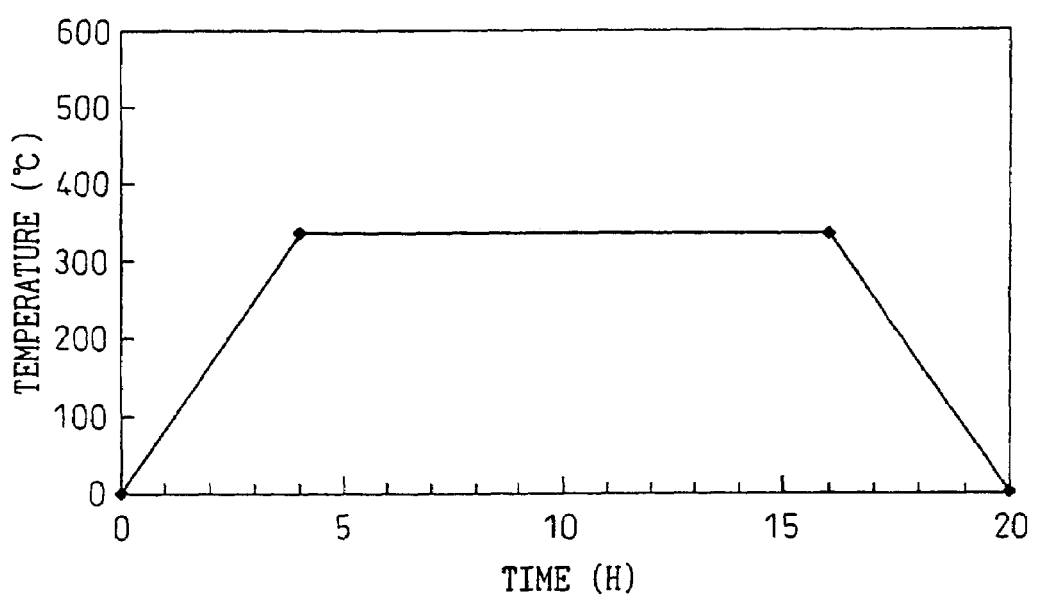
FIG. 4 is a diagram showing a temperature profile during reducing treatment in the embodiment of the invention.

A spacer 213 may be disposed between the bottom surface 219 of the saggar 21 and the ventilation plate 211 to secure ventilation at the lower part as shown in FIG. 3(b). This example uses a cordierite honeycomb for the spacer 213. Further, a metallic mesh plate can be used for the ventilation plates 211 and 212 as shown in FIG. 3(c).

Incidentally, the ventilation plate may have a honeycomb shape, a porous shape, a mesh shape, etc, so long as it has high ventilation and can withstand degreasing (particularly, heat). A suitable metal plate such as alumina or titania can be used as the material. The maximum degreasing temperature is 500° C. in this example, but the temperature is not limited if it is within the range of 400 to 650° C. Though degreasing is carried out in the atmosphere in this example, it may be conducted in a pure oxygen atmosphere.

After degreasing is finished, the unsintered stacked body is subjected to reducing treatment in a hydrogen atmosphere and is then sintered. This reducing treatment is conducted at $1\times10^{-23.5}$ atm on the basis of the temperature profile (a diagram showing the relation between the lapse of time from the start of sintering and the temperature) in an atmosphere containing 5,000 mL of Ar—H$_2$ (1%) and 6.5 to 6 mL of O$_2$ (pure) while the oxygen partial pressure during reduction is managed by an outer-furnace oxygen partial pressure.

Though this example uses Ar—H$_2$ (1%) and O$_2$, the gas concentration and the processing amount are not particularly limited so long as the environment of $1\times10^{-16}$ to $1\times10^{-24}$ atm can be achieved by the outer-furnace oxygen partial pressure. (At this time, the substantial ratio of H$_2$ and O$_2$ charged into the furnace is H$_2$:O$_2$=50:50 to 5.5). Though the temperature may be within the range of 250 to 600° C., it is preferably from 300 to 400° C.

In this example, a stainless metal having higher reactivity with oxygen than the constituent material of the electrode layer 33 is used for the furnace wall material of the furnace chamber. In a certain oxygen partial pressure atmosphere, the furnace wall reacts with a trace amount of oxygen and forms an oxide film layer that is capable of reversible reaction. This film emits oxygen when the oxygen partial pressure shifts towards the reduction side, and builds up oxygen when the oxygen partial pressure shifts towards the oxidation side, thereby keeping the change of the oxygen partial pressure within a predetermined range. In an atmosphere where the constituent materials of the electrode layer 33 are slightly oxidized, the furnace wall material is oxidized more quickly than the constituent materials of the electrode layer 33, and thus protects the electrode layer 33 (particularly, copper).

When sintering is carried out at an outer-furnace oxygen partial pressure that is outside the range described above, lead oxide of the dielectric layers 31 and 32 is reduced and metallic lead is isolated. This metallic lead reacts with copper of the electrode layer 33 and undesirably forms the liquid phase at a temperature of 327° C. or above. The same phenomenon occurs when the sintering time gets elongated. Therefore, the sintering time is preferably from 0.25 to 16 hours.

Figure 5A:
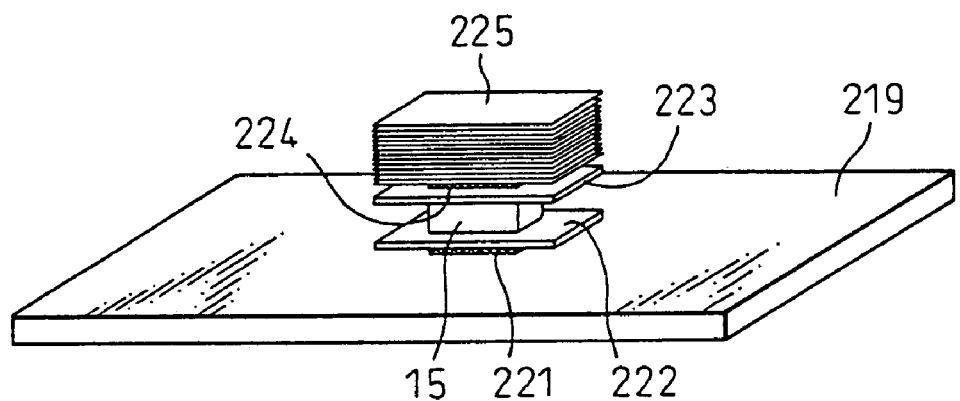
FIGS. 5(a) and 5(b) are explanatory views each showing an arrangement state of an unsintered stacked body during sintering in the embodiment of the invention.
Figure 5B:
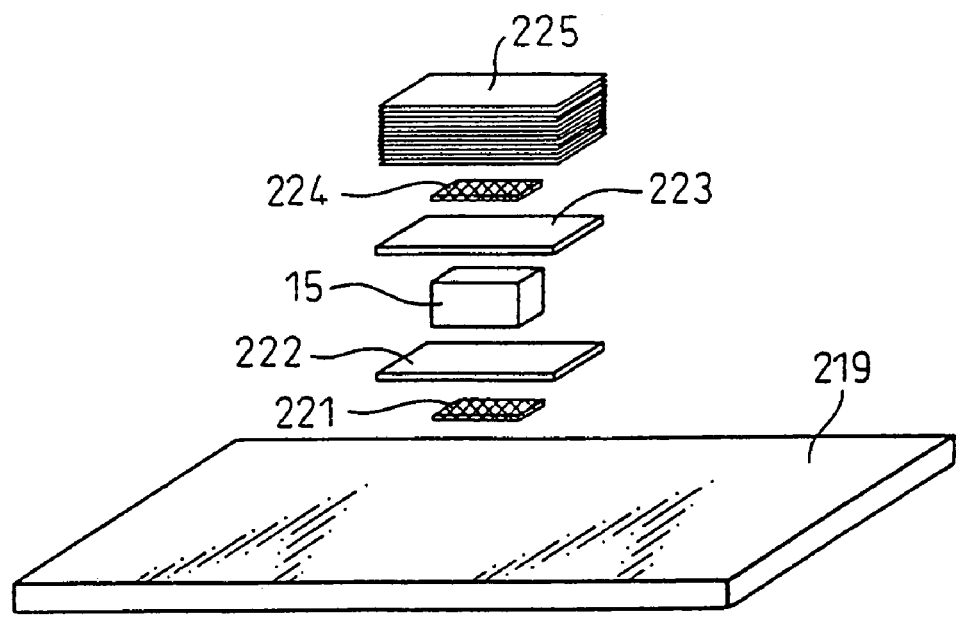
Figure 6:
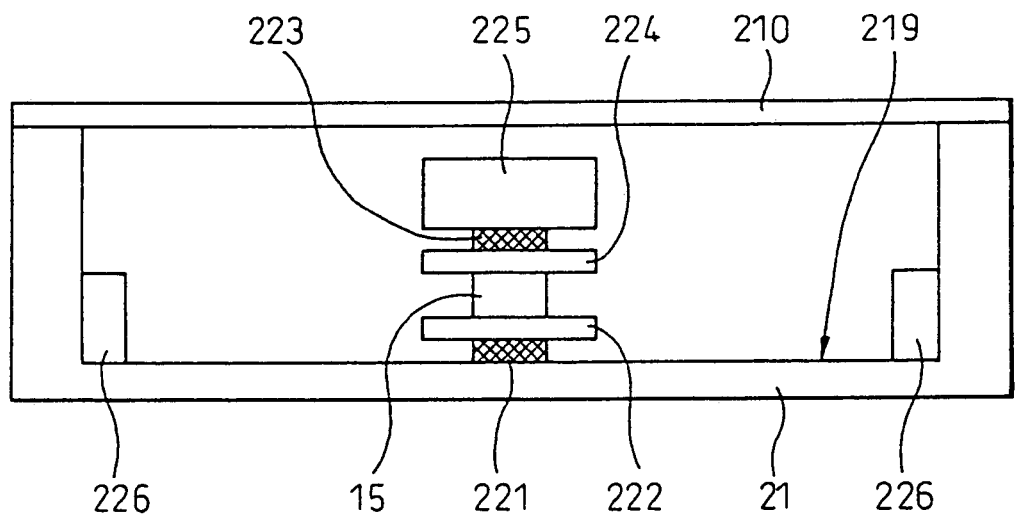
FIG. 6 is an explanatory view showing a state of a saggar during sintering in the embodiment of the invention.

A concrete sintering method will be explained. As shown in FIGS. 5(a), 5(b) and 6, the unsintered stacked body 15 is put on the bottom surface 219 of the saggar 21 formed of magnesium oxide together with the cordierite honeycomb plates 221 and 224, magnesium oxide plates 222 and 223 (15×15 mm×1 mm) and a magnesium oxide weight 225 (1 to 10 g). Reference numeral 210 in FIG. 6 denotes a cover of the saggar. To prevent lead oxide from evaporating away from the unsintered stacked body 15 during sintering, a suitable amount of masses 226 of PbZrO$_3$ are placed at corners of the saggar 21 as shown in FIG. 6. The saggar 21 having the unsintered stacked body 15 arranged therein is subjected to reduction sintering inside the sintering furnace 3 capable of sintering in the reducing atmosphere by use of CO$_2$ (pure), Ar—CO (10%) and O$_2$ (pure) in accordance with the temperature/atmosphere pattern shown in FIG. 8.

Figure 7:
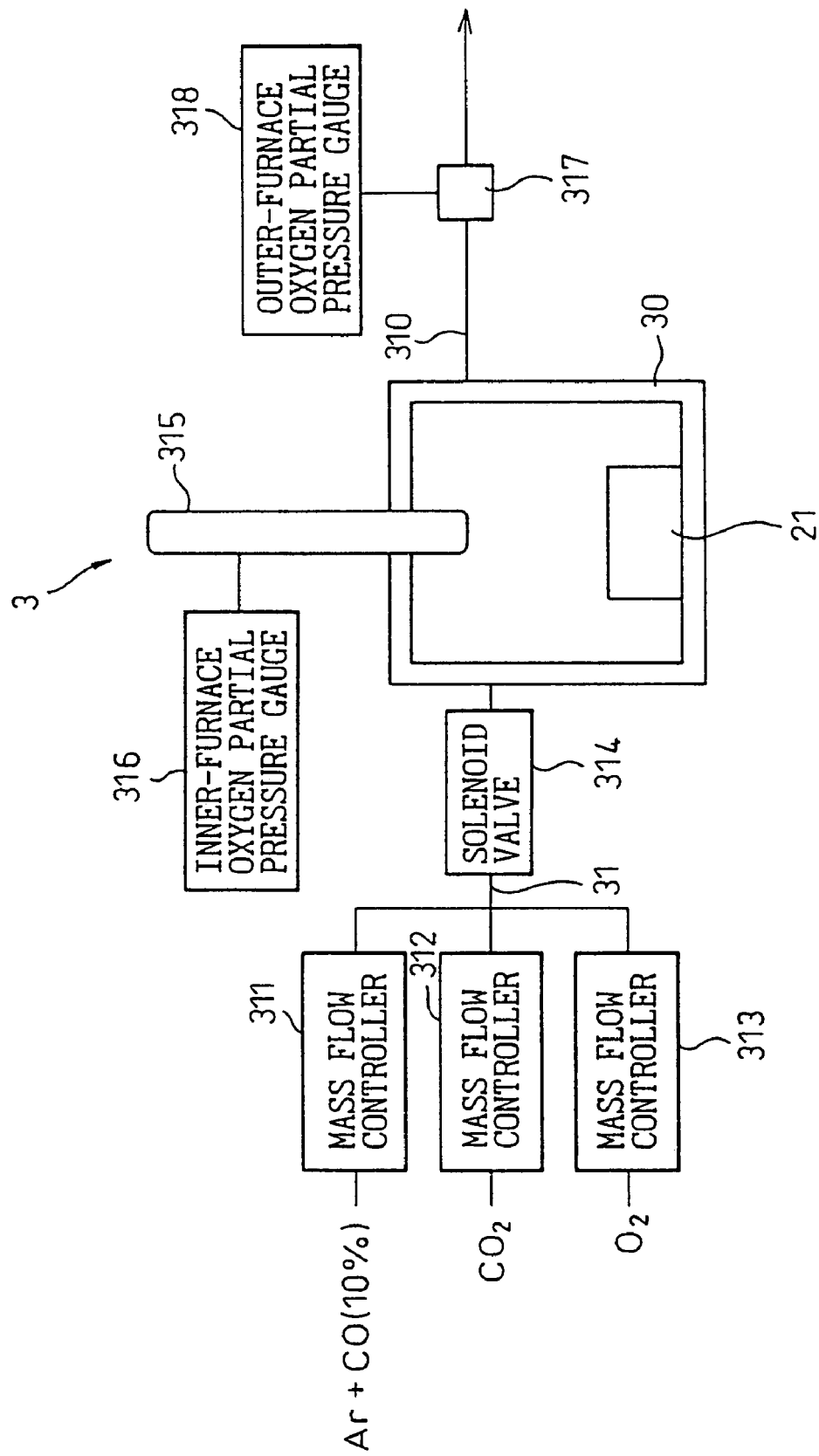
FIG. 7 is an explanatory view of a sintering furnace in the embodiment of the invention.

FIG. 7 shows the sintering furnace 3 used for this reduction sintering. The sintering furnace 3 includes a furnace chamber 30 in which the saggar is placed and in which sintering is conducted, an inner-furnace oxygen partial pressure sensor 315 inserted into the furnace chamber 30 and an outer-furnace oxygen partial pressure gauge 316 for acquiring a detection value from the sensor 315. The furnace 3 further includes mass flow controllers 311, 312 and 313 for respectively introducing Ar—CO, CO$_2$ and O$_2$ into the furnace chamber 30 and a flow path 31 equipped with a solenoid valve 314 for appropriately switching the flow paths from the mass controllers 311, 312 and 313 to the furnace chamber 30. An outer-furnace oxygen partial pressure sensor 317 and an outer-furnace oxygen partial pressure gauge 318 for acquiring an output value from the sensor 317 are interposed at intermediate portions of an exhaust system 310 extending from the furnace chamber 30 to the outside. The outer-furnace oxygen partial pressure sensor 317 and its pressure gauge 318 and the inner-furnace oxygen partial pressure sensor 315 and its pressure gauge 316 control the oxygen partial pressure of the furnace chamber 30.

The outer-furnace oxygen partial pressure sensor 317 is a zirconia $O_2$ sensor. A built-in heater always heats the sensor to 600° C. or above so that the oxygen partial pressure in the gas introduced into the outer-furnace oxygen partial pressure sensor 317 can be measured throughout the entire temperature range. On the other hand, the inner-furnace oxygen partial pressure sensor 315 is a zirconia $O_2$ sensor but does not have a built-in heater. When the furnace chamber 30 of the sintering furnace 3 is heated to about 400 to 500° C. or above, the oxygen partial pressure of the furnace chamber 30 can be measured. In this sintering furnace, the outer-surface oxygen partial pressure sensor 317 is used when the inner-furnace temperature is outside the measurement temperature range of the inner-furnace oxygen partial pressure sensor 315.

When the temperature is elevated, the outer-furnace oxygen partial pressure sensor 317 and the pressure gauge 318 control the oxygen partial pressure from room temperature to 580° C., and the inner-furnace oxygen partial pressure sensor 315 and the pressure gauge 316 control the oxygen partial pressure from 580° C. and above. When the temperature is lowered, the inner-furnace oxygen partial pressure sensor 315 and the pressure gauge 316 control the oxygen partial pressure from the maximum temperature to 600° C., and the outer-furnace oxygen partial pressure sensor 317 and the pressure gauge 318, that are installed outside the furnace, control the oxygen partial pressure from 600° C. and below.

Figure 8:
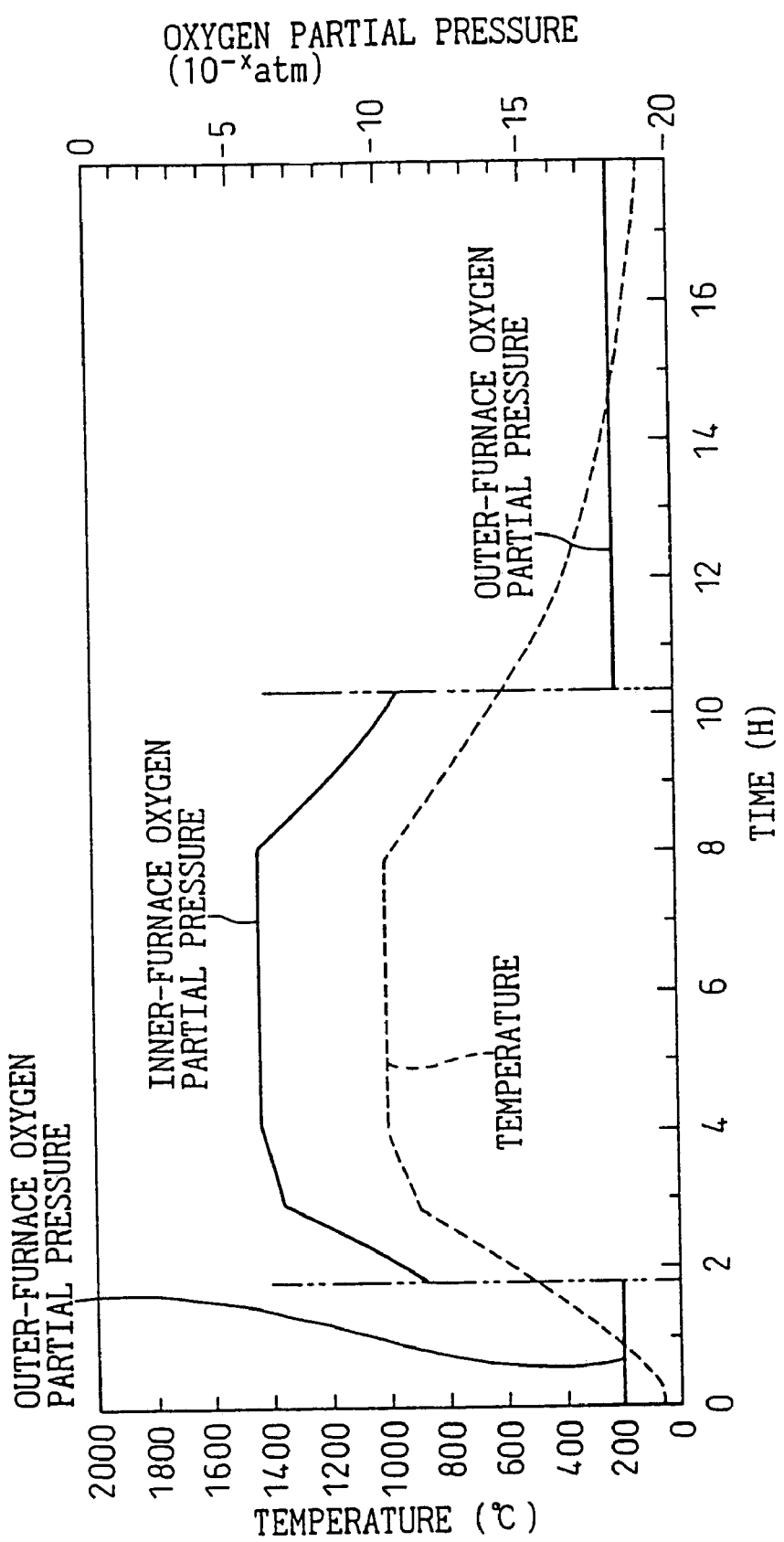
FIG. 8 is a diagram showing control of a temperature and an oxygen partial pressure during sintering.
Figure 9:
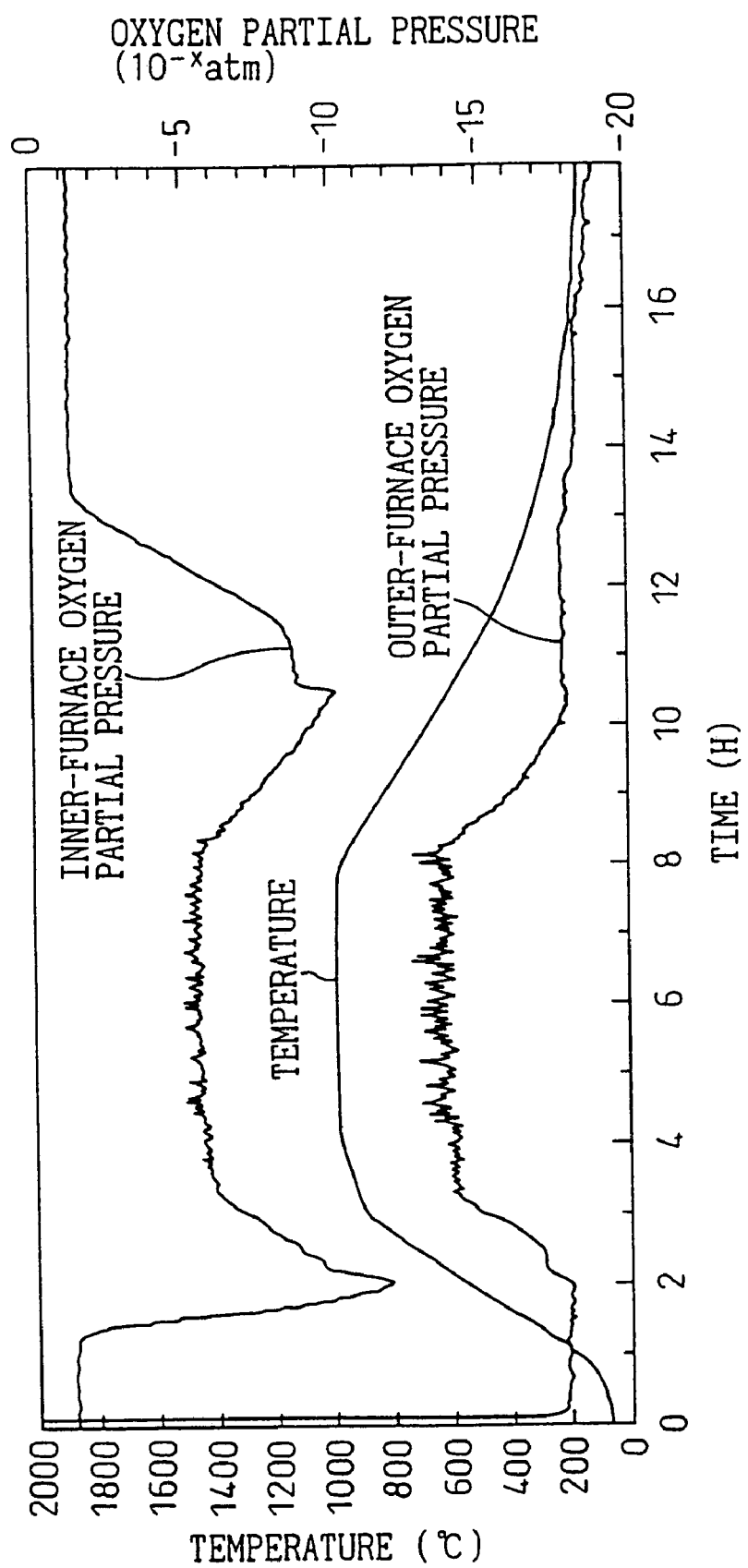
FIG. 9 is a diagram showing an internal temperature and oxygen partial pressure inside a sintering furnace during sintering.

At the temperature of 600° C. or below, the gas flow rates are again controlled to $CO_2$ (pure) to 5,000 mL+Ar—CO (10%) to 150 mL+$O_2$ (pure) to 2.8 to 5 mL, and the indication value of the outer-surface oxygen partial pressure sensor 317 is controlled to $10^{-20}$ atm to $10^{-10}$ atm. The control ranges of the temperature and the oxygen partial pressure under this state are described in a range f of a black belt in later-appearing FIG. 10. FIG. 8 shows the mode of this control with reference to the relation among the time, the temperature and the oxygen partial pressure. The value of the inner-furnace oxygen partial pressure sensor, the value of the outer-furnace oxygen partial pressure sensor and the inner temperature of the furnace in the practical sintering process are shown in the diagram of FIG. 9.

FIG. 10 shows the control ranges of the oxygen partial pressure and the temperature from 580° C. or above during temperature elevation and from 600° C. or below during temperature lowering. The inner-furnace atmosphere is controlled in such a manner as to keep the temperature and the oxygen partial pressure inside the range e represented by a black belt in the drawing. Incidentally, FIG. 10 represents the Cu+PbO coexisting range by the range encompassed by solid lines a and b under the condition of the production method of this example. The production method of the stacked ceramic body according to this example can be accomplished when the oxygen partial pressure is controlled to the range encompassed by solid line a and solid line c during sintering of the unsintered stacked body 15. Sintering is possible in some cases at a low oxygen partial pressure encompassed by solid line b and solid line d (sintering is achieved by oxygen built up inside). In FIG. 10, the abscissa represents the temperature and the ordinate does an x value when the oxygen partial pressure is expressed by $10^x$ atm. Incidentally, $10^x$ atm is equal to $1.013 \times 10^5 \times 10^x$ Pa.

The unsintered stacked body 15 is sintered as described above and the stacked ceramic body of this example shown in FIG. 11(b) is obtained. In the electrode layer 33 of the stacked ceramic body 1 so obtained, the peripheral portions near the end portions exposed on the side surface are covered with the oxidation portion 335 formed of copper oxide as shown in FIG. 11(a). The width W of this oxidation portion 335 is the length from the end portion opposing the side surface of the stacked ceramic body 1 to the deepest position at which the oxidation portion 335 is formed. It is 0.4 mm in this example.

Figure 12A:
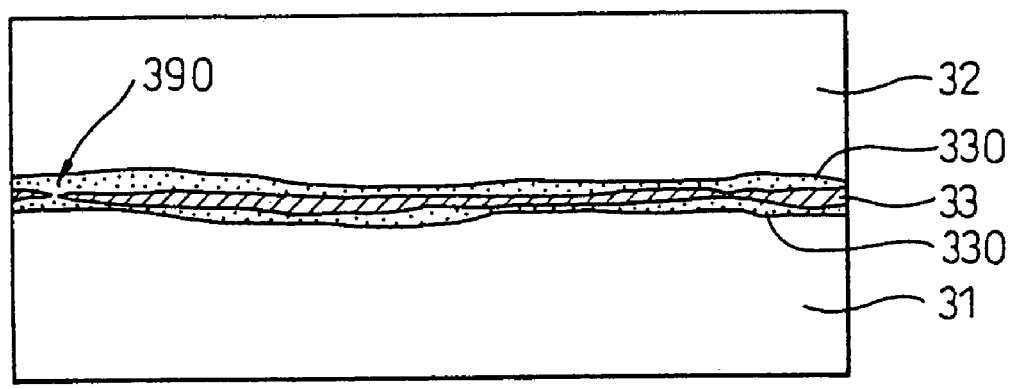
FIG. 12(*a*) is a schematic view showing an electrode layer and an oxidation portion in a comparative example and FIG. 12(*b*) is a schematic view showing an electrode layer and an oxidation portion in the embodiment of the invention.
Figure 12B:
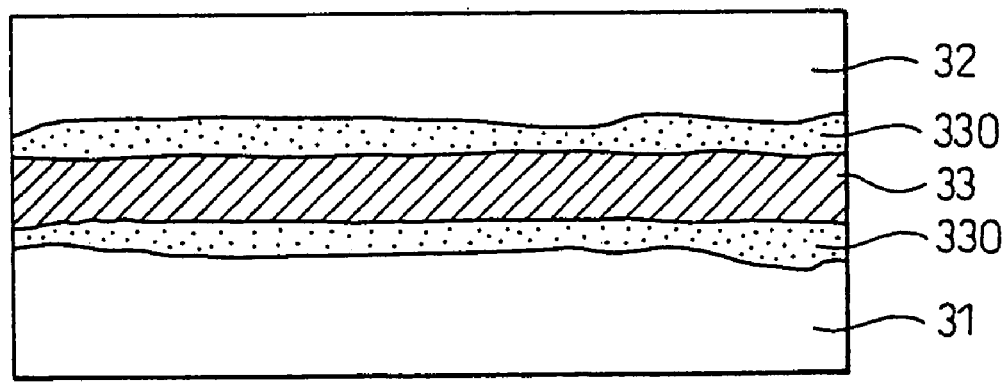

FIG. 12(b) schematically shows the section of the resulting stacked ceramic body 1. The electrode layer 33 is formed between the dielectric layers 31 and 32, and the diffusion portion 330 expands from the surface of the electrode layer 33 towards the dielectric layers 31 and 32. The stacked ceramic body obtained by the production method of this example has the electrode layer 33 the thickness of which is substantially uniform. The maximum thickness of the electrode layer 33 is 8 μm and that of the diffusion portion is 1 μm in this example.

A stacked ceramic body as a comparative example is fabricated by similarly conducting sintering while the inside of the furnace is kept on the reducing side, that is, on the side at which the oxygen partial pressure is low, in the diagram of FIG. 10. FIG. 12(a) schematically shows the section of the resulting stacked ceramic body 1. In this case, an electrode layer 33 that is interrupted and discontinuous (see reference numeral 390) is formed, and the diffusion portion 330 exists, too. However, the electrode layer 33 is much thinner than the electrode layer 33 of the stacked ceramic body 1 obtained by this example (see FIG. 12(b)). This is because metallic lead isolated from the dielectric layers 31 and 32 reacts with copper of the electrode layer 33, is partially fused, and is shaped into islands. When the stacked ceramic body having such an interrupted electrode layer 33 is used as the piezoelectric device, conduction defect to the dielectric layers 31 and 32 occurs. Further, because the voltage application area to the dielectric layers 31 and 32 becomes small, the extension/contraction amount is small, and the piezoelectric device has a poor performance.

The operation and effect of this example will be explained. In this example, the unsintered stacked body 15 after degreasing is subjected to reducing treatment in the hydrogen atmosphere and is then sintered during its production process. Copper oxide contained in the print portion 13 changes to metallic copper in this reducing treatment in the hydrogen atmosphere. At this time, lead oxide and oxide compounds of lead contained in the green sheets 11 and 12 (dielectric layers 31 and 32) are also reduced to lead as the side reaction. As the atmosphere is kept at the reducing atmosphere hardly containing oxygen during sintering from room temperature, lead oxide and oxide compounds of lead contained in the green sheets 11 and 12 (dielectric layers 31 and 32) in the unsintered stacked body 15 are also reduced and metallic lead is isolated.

When lead exists in the unsintered stacked body 15 and when sintering is carried out on the reducing side (the range where the oxygen partial pressure is small) from the Cu+PbO coexisting range shown in FIG. 10, lead and copper react with each other and change to the liquid phase in the unsintered stacked body 15, and lead and copper so liquefied are likely to aggregate in an island form, giving interrupted electrode layers (see FIG. 12(a)). These lead and copper in the liquid phase are also likely to be pushed out from the unsintered stacked body 15. Since the reaction between lead and copper occurs at a low temperature of about 320° C., it is difficult to prevent the reaction by merely adjusting the temperature. To solve this problem, therefore, it is necessary to suppress the generation of metallic lead and to return metallic lead that has already been formed to the original lead oxide.

When the sintering condition is controlled to the oxidizing side (the range where the oxygen partial pressure is high) from the Cu+PbO coexisting range as shown in FIG. 10, lead oxide contained in the green sheets 11 and 12 (dielectric layers 31 and 32) and copper oxide contained in the print portion 13 react with each other and are liquefied inside the unsintered stacked body 15. Consequently, copper oxide diffuses in the unsintered stacked body 15 at a temperature of 680° C. or above.

To return metallic lead to original lead oxide and oxide compounds of lead, this example controls the gas flow rates of $CO_2$ (pure) 500 mL+Ar—CO (10%) 150 mL+$O_2$ (pure) 2.8 to 5 mL from the room temperature to 580° C. during temperature elevation as described above, so that the outer-furnace oxygen partial pressure sensor 317 has the value of $10^{-20}$ to $10^{-10}$ atm. Since this example conducts such a control, it can suppress the generation of metallic lead and at the same time, can oxidize metallic lead that has already been formed, and can return it to lead oxide and the oxide compounds of lead. Therefore, the reaction between copper and lead hardly occurs.

When lead formed during the reduction of the electrode reacts with copper and forms the liquid phase inside the unsintered stacked body 15, the liquefied electrode material is pushed outside. Moreover, this liquefaction is likely to occur from low temperatures.

When sintering is conducted while the temperature and the oxygen partial pressure are controlled as described in this example, copper exposed on the surface of the electrode layer 33 in the unsintered stacked body 15 is oxidized to copper oxides (monovalent and divalent: solid) from the room temperature to 580° C., and the copper oxide operates as a barrier and forms the oxidation portion 335 shown in FIGS. 1(a) and 1(b) even when metallic lead and copper react with each other and are liquefied inside the unsintered stacked body. As a consequence, internal copper is prevented from being discharged outside the unsintered stacked body 15, and the formation of the interrupted electrode layer 33 is prevented, too.

As described above, this example can provide a stacked ceramic body which prevents the reaction between the component of the dielectric layer and the component of the electrode layer in the unsintered stacked body during sintering, and in which both components are not easily liquefied, and a production method of such a stacked ceramic body.

What is claimed is:

1. A method of producing a stacked ceramic body comprising the steps of:
   arranging a printed portion formed of an electrode paste consisting of copper or a copper compound as its main component on a green sheet formed of an oxide dielectric containing a lead oxide as its constituent element to form a print sheet;
   stacking a plurality of said print sheets to form an unsintered stacked body;
   conducting a degreasing treatment by heat-treating for removing organic components contained in said unsintered stacked body; and
   sintering said unsintered stacked body in a reducing atmosphere while controlling an oxygen partial pressure from room temperature to 400 to 600° C. to a range of $10^{-10}$ to $10^{-20}$ atm ($1.013 \times 10^{-5} (=10^{-4.994})$ to $1.013 \times 10^{-15} (=10^{-14.99})$Pa) including an oxygen partial pressure at which copper and lead oxide can coexist, and a higher oxygen partial pressure than said oxygen partial pressure at which copper and lead oxide can coexist.

2. A method of producing a stacked ceramic body according to claim 1, wherein said print sheet is formed by disposing a print portion formed of an electrode paste consisting of copper oxide as its main component.

3. A method of producing a stacked ceramic body according to claim 2, wherein said print portion consisting of copper oxide contained in said unsintered stacked body as its main component is subjected to reducing treatment in a reducing atmosphere containing hydrogen to form a print portion consisting of copper as its main component.

4. A method of producing a stacked ceramic body according to claim 1, wherein, when said unsintered stacked body is sintered in a reducing atmosphere, temperature elevation is continued from 400 to 600° C., and an oxygen partial pressure in said reducing atmosphere is controlled to an oxygen partial pressure at which copper and lead oxide can coexist or to an oxygen pressure higher than said oxygen partial pressure at which copper and lead oxide can coexist, until the temperature reaches 900 to 1,000° C.

5. A method of producing a stacked ceramic body according to claim 4, wherein, when said unsintered stacked body is sintered in a reducing atmosphere, an oxygen partial pressure at each temperature is controlled to a range satisfying the following condition:

1,000° C.:
$$10^{-4} \text{ to } 10^{-7.9} \text{ atm } (10.13(=10^{1.0056}) \text{ to } 1.276 \times 10^{-3} (=10^{-2.894})\text{Pa})$$

900° C.:
$$10^{-5} \text{ to } 10^{-10.1} \text{ atm } (1.013 (=10^{0.0056}) \text{ to } 8.049 \times 10^{-6} (=10^{5.094})\text{Pa})$$

800° C.:
$$10^{-6} \text{ to } 10^{-12.2} \text{ atm } (1.013 \times 10^{-1}(=10^{-0.9944}) \text{ to } 6.393 \times 10^{-8}(=10^{-7.194})\text{Pa})$$

700° C.:
$$10^{-7} \text{ to } 10^{-14.5} \text{ atm } (1.013 \times 10^{-2}(=10^{-1.994}) \text{ to } 3.204 \times 10^{-10}(=10^{-9.494})\text{Pa})$$

600° C.:
$$10^{-8} \text{ to } 10^{-16.6} \text{ atm } (1.013 \times 10^{-3}(=10^{-2.994}) \text{ to } 2.545 \times 10^{-12}(=10^{-11.59})\text{Pa})$$

500° C.:
$$10^{-9} \text{ to } 10^{-18.8} \text{ atm } (1.013 \times 10^{-4}(=10^{-3.994}) \text{ to } 1.606 \times 10^{-14}(=10^{-13.79})\text{Pa}).$$

* * * * *